United States Patent [19]
Nakazawa et al.

[11] Patent Number: 6,074,707
[45] Date of Patent: Jun. 13, 2000

[54] METHOD OF PRODUCING MAGNETORESISTIVE ELEMENT

[75] Inventors: Yukie Nakazawa; Masamichi Saito; Naoya Hasegawa; Akihiro Makino, all of Niigata-ken, Japan

[73] Assignee: Alps Electric Co., Ltd., Japan

[21] Appl. No.: 09/018,919

[22] Filed: Feb. 5, 1998

[30] Foreign Application Priority Data

Feb. 7, 1997 [JP] Japan .................................. 9-025601

[51] Int. Cl.$^7$ ...................................................... H01F 1/00
[52] U.S. Cl. .......................... 427/547; 427/598; 427/130; 427/131; 427/132; 427/404; 427/419.1; 427/380
[58] Field of Search ..................................... 427/547, 598, 427/130, 131, 132, 404, 419.1, 380; 204/192.2

[56] References Cited

U.S. PATENT DOCUMENTS

| | | | |
|---|---|---|---|
| 4,944,805 | 7/1990 | Nakanishi | 148/108 |
| 5,187,860 | 2/1993 | Horibata et al. | 29/603 |
| 5,206,590 | 4/1993 | Dieny et al. | 324/252 |
| 5,214,840 | 6/1993 | Imagawa et al. | 29/603 |
| 5,380,548 | 1/1995 | Lin et al. | 427/130 |
| 5,382,301 | 1/1995 | Ohkubo et al. | 148/108 |
| 5,565,236 | 10/1996 | Gambino et al. | 427/130 |
| 5,612,098 | 3/1997 | Tan et al. | 427/529 |

*Primary Examiner*—Shrive Beck
*Assistant Examiner*—Paul D. Strain
*Attorney, Agent, or Firm*—Brinks Hofer Gilson & Lione

[57] ABSTRACT

The present invention provides a method of producing a magnetoresistive element in which a laminate including a free ferromagnetic layer in which at least magnetization is freely rotated according to an external magnetic field, a non-magnetic layer, and a pinned ferromagnetic layer in which reversal of magnetization is pinned is formed, and is heat-treated for setting different directions of the easy axis of magnetization of the free ferromagnetic layer and the pinned ferromagnetic layer under different conditions. In the heat treatment, first annealing is performed at the predetermined temperature in a magnetic field applied in a first direction, and second annealing is performed in a magnetic field applied in a second direction substantially perpendicular to the first direction so that the easy axis of magnetization of the free ferromagnetic layer is substantially perpendicular to that of the pinned ferromagnetic layer.

29 Claims, 5 Drawing Sheets

METHOD OF PRODUCING MAGNETORESISTIVE ELEMENT

BACKGROUND OF THE INVENTION

1. Field of the Invention

The present invention relates to a method of producing a magnetoresistive element used for a magnetic head, a potentiosensor, an angular sensor and the like.

2. Description of the Related Art

As an example of conventional magnetoresistive elements which employ a giant magnetoresistive effect, the magnetoresistive element disclosed in U.S. Pat. No. 5,206,590 is known.

As shown in FIG. 8, the magnetoresistive element A disclosed in this publication comprises a first ferromagnetic layer 2 made of a soft magnetic material, a non-magnetic layer 3, a second ferromagnetic layer 4 and an antiferromagnetic layer 5, which are laminated on a non-magnetic substrate 1. The magnetization direction B of the second ferromagnetic layer 4 is fixed by magnetic exchange coupling by the antiferromagnetic layer 5, and the magnetization direction C of the first ferromagnetic layer 2 is perpendicular to the magnetization direction B of the second ferromagnetic layer 4 in the absence of an applied magnetic field. However, the magnetization direction C of the first ferromagnetic layer 2 is not fixed and brought into a free state so that the direction C can be rotated by an external magnetic field.

When an applied magnetic field h is applied to the structure shown in FIG. 8, the magnetization direction C of the first ferromagnetic layer 2 is rotated as shown by arrows of chain lines in accordance with the direction of the applied magnetic field h, and an angle difference in magnetization direction occurs between the first ferromagnetic layer 2 and the second ferromagnetic layer 4, thereby causing a change in resistance. This enables detection of a magnetic field.

In manufacture of the magnetoresistive element A having the structure shown in FIG. 8, as a method of controlling the direction of the exchange coupling magnetic field produced by the antiferromagnetic layer 5 to an appropriate direction, there are methods including a method in which a magnetic field is applied in any desired direction (for example, the direction perpendicular to the easy magnetization axis of the first ferromagnetic layer 2 made of a soft magnetic material) in deposition of the antiferromagnetic layer 5, and a method in which after each of layers are laminated, the layers must be heat-treated by heating to a temperature over the blocking temperature and then cooling to room temperature while applying a magnetic field in the direction perpendicular to the easy magnetization axis of the first ferromagnetic layer 2 made of a soft magnetic material.

In the magnetoresistive element A having the above structure, the magnetoanisotropy of each of the magnetic layers is controlled by deposition in a magnetic field or heat treatment in a magnetic field, and thus the direction of easy axis of magnetization of the first ferromagnetic layer 2 is set to the same direction as the easy magnetization axis of the second ferromagnetic layer 4.

However, in a structure wherein the magnetization directions of the two ferromagnetic layers 2 and 4 are set to the same direction, the coercive force of the first ferromagnetic layer 2 which is free in magnetization rotation cannot be decreased, thereby consequently causing the problem of increasing the hysteresis in the minor loop of a magnetization curve obtained by the first ferromagnetic layer 2. Therefore, in the conventional structure shown in FIG. 8, it is necessary to employ a structure in which the rotation of magnetization of the first ferromagnetic layer 2 is stabilized by applying an excess of bias magnetic field

SUMMARY OF THE INVENTION

The present invention has been achieved in consideration of the above situation, and an object of the present invention is to provide a method of producing a magnetoresistive element which is capable of decreasing the coercive force of a first ferromagnetic layer without deteriorating required characteristics such as the magnetoresistive effect, an exchange coupling magnetic field, etc., and which is capable of improving output and stability, and decreasing the amount of a hard bias required for the magnetoresistive element.

In order to achieve the object, the present invention provides a method of producing a magnetoresistive element comprising forming a laminate comprising a free ferromagnetic layer in which at least magnetization is freely rotated according to an external magnetic field, a non-magnetic layer, and a pinned ferromagnetic layer in which reversal of magnetization is pinned; and heat-treating the free ferromagnetic layer and the pinned ferromagnetic layer under different conditions for setting different directions of easy axes of magnetization of the two layers, wherein the heat treatment comprises first annealing at a predetermined temperature in a magnetic field applied in a first direction, and second annealing in a magnetic field applied in the second direction perpendicular to the first direction so that the easy axis of magnetization of the free ferromagnetic layer is perpendicular to the easy axis of magnetization of the pinned ferromagnetic layer.

In order to achieve the object, in the present invention, the magnetic field in the second direction is smaller than the magnetic field in the first direction or smaller than the exchange coupling magnetic field of the pinned ferromagnetic layer.

The magnetic field in the first direction can be set to 1 to 4 kOe, and the magnetic field in the second direction can be set to 50 to 400 Oe.

In the present invention, the retention temperature of the first annealing can be set to 210 to 250° C., and the retention temperature of the second annealing can be set to not more than the blocking temperature (the temperature at which the exchange coupling magnetic field of the pinned ferromagnetic layer disappears) of the antiferromagnetic layer.

In the present invention, the retention temperature of the second annealing can be set to 150 to 250° C.

In the present invention, the free ferromagnetic layer can be made of any one of NiFe, CoFe and Co alloys, the non-magnetic layer can be made of any one of Cu, CuAu, and CuNi, and the pinned ferromagnetic layer can be made of any one of NiFe, CoFe and Co, and provided adjacent to an antiferromagnetic layer made of any one of PtMn, NiMn, IrMn, RhMn, and PdMn.

BRIEF DESCRIPTION OF THE DRAWINGS

FIGS. 3A, 3B and 3C are drawings each showing the direction of an applied magnetic field during annealing performed in the present invention, in which FIG. 3A is a drawing showing the direction of an applied magnetic field in first annealing, FIG. 3B is a drawing showing the direction of an applied magnetic field in second annealing, and FIG. 3C is a drawing showing the direction of each of the applied magnetic fields, and the directions of applied magnetic fields in measurement of R-H curves in examples;

DESCRIPTION OF THE PREFERRED EMBODIMENT

The present invention will be described in further detail below with reference to the drawings.

Figure 1:
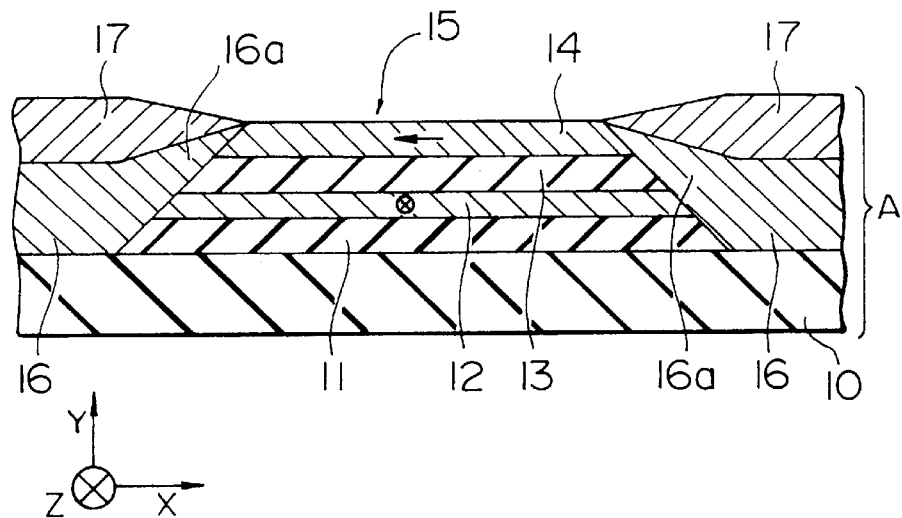
FIG. 1 is a sectional view of a magnetoresistive element obtained by a production method in accordance with a first embodiment of the present invention.

FIG. 1 shows a magnetoresistive element produced by a method in accordance with an embodiment of the present invention. The magnetoresistive element A shown in FIG. 1 mainly comprises a laminate having a trapezoidal sectional form and formed by laminating an antiferromagnetic layer 11, a pinned ferromagnetic layer 12, a non-magnetic layer 13 and a free ferromagnetic layer 14 on a substrate 10; hard bias hard magnetic layers 16 provided on both sides of the laminate 15, and electrode layers 17 respectively laminated on the hard magnetic layers 16.

In the structure of this embodiment, the hard magnetic layers 16 are provided to cover the sides of the antiferromagnetic layer 11, the pinned ferromagnetic layer 12, the non-magnetic layer 13 and the free ferromagnetic layer 14 at the ends 16a thereof, but the relation of the thicknesses of the respective layers is not limited to the structure shown in FIG. 1.

The substrate 10 is made of glass, Si, $Al_2O_3$, TiC, SiC, a sintered product of $Al_2O_3$ and TiC, a non-magnetic material such as Zn ferrite, or the like. On the upper surface of the substrate may be provided a coating layer or a buffer layer made of a non-magnetic material such as Ta or the like in order to eliminate irregularities and waviness in the upper surface of the substrate or improving the crystal alignment of a layer laminated thereon.

The antiferromagnetic layer 11 is provided for pinning the magnetization direction of the pinned ferromagnetic layer 12 formed thereon by acting a magnetic exchange coupling force to the pinned ferromagnetic layer 12. The antiferromagnetic layer 11 is made of an antiferromagnetic material, for example, PtMn, NiMn, IrMn, RhMn, PdMn, $\alpha$-$Fe_2O_3$, or the like.

Each of the ferromagnetic layers 12 and 14 comprises a thin film of a ferromagnetic material, specifically an Ni—Fe alloy, a Co—Fe alloy, an Ni—Co alloy, Co, an Ni—Fe—Co alloy, or the like. The ferromagnetic layer 12 can be made of a Co layer, the ferromagnetic layer 14 can be made of an Ni—Fe alloy or a laminated structure comprising a Co layer and an Ni—Fe alloy layer. In the case of a two-layer structure comprising a Co layer and an Ni—Fe alloy layer, a structure can be formed in which a thin Co layer is disposed on the non-magnetic layer side.

This is due to the fact that in a giant magnetoresistive effect generating mechanism of a structure comprising the ferromagnetic layers 12 with the non-magnetic layer 13 held therebetween, the spin depending scattering effect of conduction electrons at an interface between Co and Cu is high, and a structure comprising the ferromagnetic layers 12 made of the same material has the lower possibility of causing factors other than the spin depending scattering of conduction electrons and the higher magnetoresistive effect than a structure comprising the ferromagnetic layers 12 and 14 made of different materials. Therefore, when the ferromagnetic layer 12 is made of Co, a structure is preferable in which the non-magnetic layer side of the ferromagnetic layer 14 is replaced by a Co layer by a predetermined thickness. Even if a separate Co layer is not provided, an alloy structure may be used in which a large amount of Co is contained in the non-magnetic layer side of the ferromagnetic layer 14 to form a concentration gradient layer in which the Co concentration gradually decreases toward the side opposite to the non-magnetic layer 13.

The non-magnetic layer 13 is made of a non-magnetic material such as Cu, Cr, Au, Ag, or the like, and is preferably formed to a thickness of 20 to 40 Å. When the thickness of the non-magnetic layer 13 is less than 20 Å, magnetic coupling easily occurs between the ferromagnetic layer 12 and the ferromagnetic layer 14. When the thickness of the non-magnetic layer 13 is over 40 Å, the ratio of the conduction electrons scattered in the interfaces between the non-magnetic layer 13 and the ferromagnetic layers 12 and 14 which cause the magnetoresistive effect is decreased, and undesirably decreasing the magnetoresistive effect due to a shunt effect of a current.

By disposing the hard magnetic layers 16 as the hard bias layers, a longitudinal bias is applied to the free ferromagnetic layer 14 to put the free ferromagnetic layer 14 in a single magnetic domain state. As a result, it is possible to suppress the occurrence of noise (Barkhausen noise) in detection of a leakage magnetic field from a magnetic medium. Each of the hard magnetic layers 16 preferably comprises a ferromagnetic material having high coercive force, such as a Co—Pt alloy or a Co—Cr—Pt alloy.

The method of producing the magnetoresistive element A having the above structure will be described below.

In production of the magnetoresistive element A having the structure shown in FIG. 1, the antiferromagnetic layer 11, the pinned ferromagnetic layer 12, the non-magnetic layer 13 and the free ferromagnetic layer 14 are laminated on the substrate 10, heat-treated under conditions which will be described below, and processed to a laminate 15 having a trapezoidal sectional shape and a width corresponding to the track width by using a patterning technique, and then the antiferromagnetic layers 16 and the electrode layers 17 are further laminated on both sides of the laminate 15.

Each of the layers can be formed as an alloy thin film on the substrate by using a thin film formation apparatus for a general purpose technique, for example, sputtering, vacuum evaporation or the like. For example, as a deposition apparatus, a high frequency double pole sputtering apparatus, a DC sputtering apparatus, a magnetron sputtering apparatus, a triple pole sputtering apparatus, an ion beam sputtering apparatus, a opposed target sputtering apparatus, and the like can be used. As the sputtering target, Co, a composite target comprising an Ni—Fe—Co alloy target and a chip of the additive element provided thereon, and the like can be used.

Figure 3A:
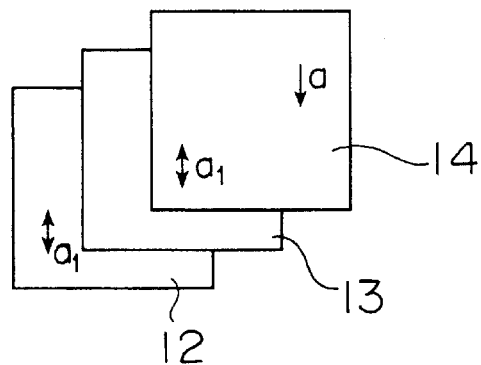

After each of the layers has been deposited, the layers are annealed by keeping at 210 to 250° C., e.g., 230° C., for several hours, e.g., 4 hours, while applying a magnetic field of 1 to 4 kOe, e.g., 2 kOe, in the direction shown by arrow a in plan views of the pinned ferromagnetic layer 12, the non-magnetic layer 13 and the free ferromagnetic layer 14 in FIG. 3A, and then slowly cooling the layers.

In the present invention, a temperature of 210 to 250° C. means a temperature of not less than 210° C. and not more than 250° C.

The heating temperature is set to 210° C. or more in order to obtain sufficient exchange coupling between the pinned ferromagnetic layer 12 and the antiferromagnetic layer 11 of PtMn. The upper limit is 250° C. because at a temperature higher than this, ΔMR is decreased due to thermal damage in the interfaces with the non-magnetic layer 13.

The above heat treatment sets the directions of the easy magnetization axes of the pinned ferromagnetic layer 12 and the free ferromagnetic layer 14 in the $a_1$ direction.

Figure 3B:
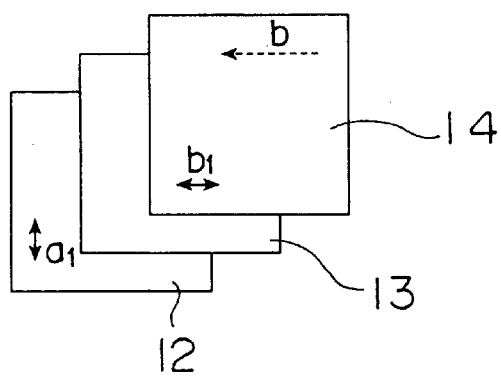

Then, the layers are annealed by keeping at 150 to 250° C. lower than the blocking temperature, for preferably 180 to 220° C., e.g., 200° C., for several hours, e.g., 2 hours, while applying a magnetic field of 5 to 400 Oe, e.g., 100 Oe, in a direction shown by arrow b (the direction perpendicular to the direction a) in plan views of the pinned ferromagnetic layer 12, the non-magnetic layer 13 and the free ferromagnetic layer 14 in FIG. 3B, and then slowly cooling the layers. In this annealing, the upper limit of the annealing temperature is set to 250° C. because a temperature high than this is close to the blocking temperature (the temperature at which the exchange coupling magnetic field of the pinned ferromagnetic layer disappears) of the antiferromagnetic layer 11, thereby causing the possibility that $H_{ex}$ (the coercive force of the pinned ferromagnetic layer) is eliminated, and decreasing ΔMR.

The direction of easy magnetization axis of the free ferromagnetic layer 14 is changed to the $b_1$ direction by the strength of the magnetic field and heat treatment, while the direction of the easy axis of magnetization of the pinned ferromagnetic layer 12 is kept in the $a_1$ direction.

As described above, in the magnetoresistive element A produced through the two-step heat treatment in a magnetic field, the magnetization directions of the ferromagnetic layers 12 and 14 vertically adjacent to each other with the non-magnetic layer 11 therebetween are perpendicular to each other at an external magnetic field of zero, as shown in FIG. 1. However, when a leakage magnetic field from the magnetic medium acts on the magnetoresistive element A in the direction Z shown in FIG. 1, the magnetization direction of the free ferromagnetic layer 14 is rotated. At this time, the resistance changes with rotation of the magnetization direction, and thus whether or not a magnetic field acts can be detected by detecting the change in resistance.

In the above structure, since the direction of the easy axis of magnetization of the pinned ferromagnetic layer 12 is the $a_1$ direction shown in FIG. 3A, and the direction of easy axis of magnetization of the free ferromagnetic layer 14 is the $b_1$ direction shown in FIG. 3B, both directions being perpendicular to each other, it is possible to decease the leakage magnetic field from the magnetic medium and the coercive force of the free ferromagnetic layer 14 in the Z direction shown in FIG. 1 while maintaining the high magnetoresistive effect. Therefore, it is possible to apply a smaller bias by a hard bias structure than a conventional structure, and obtain the effect of improving output and the effect of improving stability.

Figure 2:
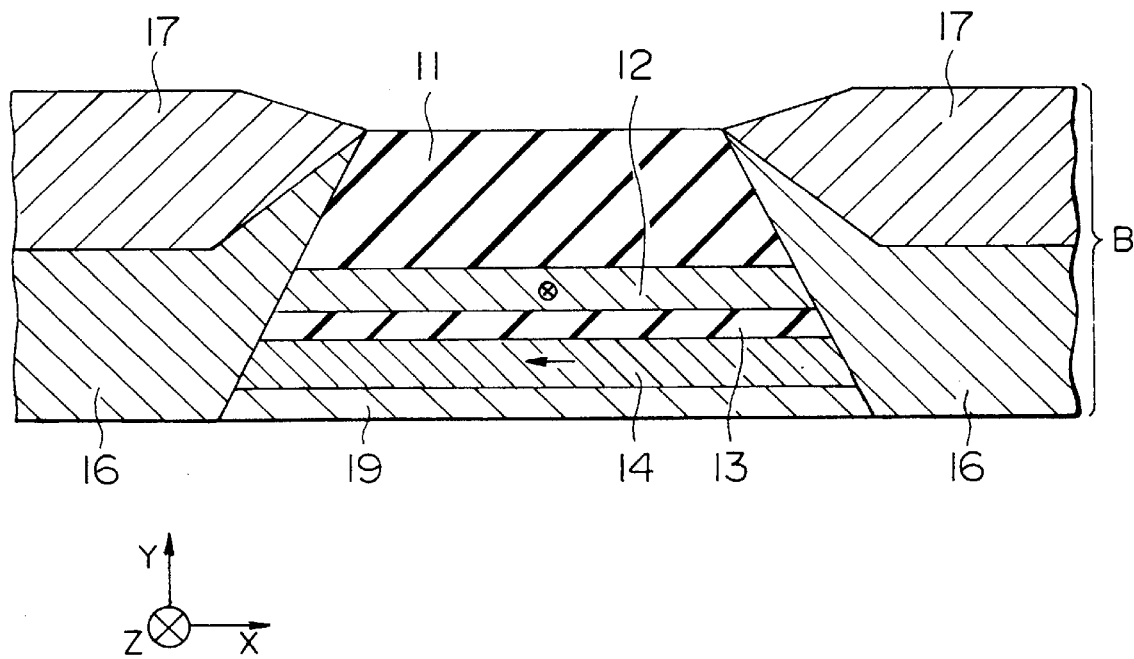
FIG. 2 is a sectional view of a magnetoresistive element obtained by a production method in accordance with a second embodiment of the present invention.

The production method of the present invention can also be applied to the magnetoresistive element B shown in FIG. 2. The magnetoresistive element B shown in FIG. 2 mainly comprises a laminate 18 having a trapezoidal sectional form and comprising a base layer 19 made of Ta or the like, a free ferromagnetic layer 14, a non-magnetic layer 13, a pinned ferromagnetic layer 12 and an antiferromagnetic layer 11, which are laminated in turn on a substrate; hard bias hard magnetic layers 16 provided on both sides of the laminate 18, and electrode layers 17 respectively laminated on the hard magnetic layers 16. Although, in FIG. 2, the base layer 19 made of a non-magnetic material such as Ta or the like is deposited on the substrate in order to arrange the crystal orientation, and then the free ferromagnetic layer 14 is laminated thereon, the base layer 19 may be appropriately formed, and is not necessarily provided. In order to protect the laminate 18, a protective layer may be provided on the antiferromagnetic layer 11 serving as the uppermost layer. The operation principle of the magnetoresistive element B formed as described above is the same as the magnetoresistive element A shown in FIG. 1.

Like the magnetoresistive element A shown in FIG. 1, an alloy structure may be used in which a large amount of Co is contained on the non-magnetic layer side of the free ferromagnetic layer 14 to form a concentration gradient layer in which the Co concentration gradually decreases toward the side opposite to the non-magnetic layer 13.

EXAMPLES

Example 1

On an Si substrate coated with an $Al_2O_3$ film was formed a laminate by sputtering using a high frequency magnetron sputtering apparatus and a plurality of targets to form a laminated structure of Ta (50 Å)/PtMn (300 Å)/CoFe (30 Å)/Cu (22 Å)/CoFe (10 Å)/NiFe (70 Å)/Ta (50 Å), followed by two-step heat treatment in a magnetic field under the conditions shown in Table 1 to produce the magnetoresistive element A shown in FIG. 1.

In this example, PtMn having the composition $Pt_{48}Mn_{52}$ (at %), CoFe having the composition $CO_{90}Fe_{10}$ (at %), and NiFe having the composition $Ni_{80}Fe_{20}$ (at %) were used. The magnetic field direction of first annealing shown in Table 1 represents the magnetic field in the $a_1$ direction shown in FIG. 3A applied in annealing, and the magnetic field direction of second annealing shown in Table 1 represents the magnetic field in the $b_1$ direction shown in FIG. 3B applied in annealing.

TABLE 1

| | Conditions of First Annealing and Characteristics after Annealing | | | |
|---|---|---|---|---|
| Annealing temp., Applied magnetic field | ΔMR (%) | Hex (Oe) | Hcf (Oe) | Easy axis of magnetization of Free layer |
| 210° C. × 4HR, 2kOe | 7.7 | 500 | 4 | Magnetic field direction of first annealing |
| 230° C. × 4HR, 2kOe | 7.5 | 700 | 3 | Magnetic field direction of first annealing |

TABLE 1-continued

Conditions of First Annealing and Characteristics after Annealing

| Annealing temp., Applied magnetic field | ΔMR (%) | Hex (Oe) | Hcf (Oe) | Easy axis of magnetization of Free layer | |
|---|---|---|---|---|---|
| | 7.5 | 700 | 3 | Magnetic field direction of first annealing | |
| | 7.5 | 700 | 3 | Magnetic field direction of first annealing | |
| | 7.5 | 700 | 3 | Magnetic field direction of first annealing | |
| | 7.5 | 700 | 3 | Magnetic field direction of first annealing | |
| | 7.5 | 700 | 3 | Magnetic field direction of first annealing | |
| 250° C. × 2HR, 2kOe | 7.5 | 700 | 3 | Magnetic field direction of first annealing | |
| Conditions of Second Annealing and Characteristics after Annealing | | | | | |
| 200° C. × 2HR, 50 Oe | 7.6 | 500 | ≦0.5 | Magnetic field direction of second annealing | |
| 100° C. × 2HR, 50 Oe | 7.4 | 700 | 3 | Magnetic field direction of first annealing | (Comparative Example) |
| 180° C. × 2HR, 50 Oe | 7.5 | 680 | ≦0.5 | Magnetic field direction of second annealing | |
| 200° C. × 2HR, 50 Oe | 7.4 | 720 | ≦0.5 | Magnetic field direction of second annealing | |
| 220° C. × 2HR, 50 Oe | 7.4 | 680 | ≦0.5 | Magnetic field direction of second annealing | |
| 200° C. × 2HR, 100 Oe | 7.5 | 700 | ≦0.5 | Magnetic field direction of second annealing | |
| 200° C. × 2HR, 200 Oe | 7.4 | 660 | ≦0.5 | Magnetic field direction of second annealing | |
| 200° C. × 2HR, 50 Oe | 7.3 | 700 | ≦0.5 | Magnetic field direction of second annealing | |

: Si substrate/aluminum oxide/Ta50Å/PtMn300Å/CoFe30Å/Cu22Å/CoFe10Å/NiFe70Å/Ta50Å

Figure 3C:
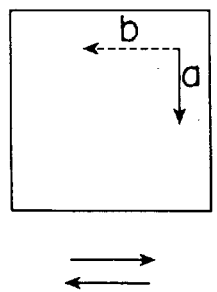

As be seen from the values of ΔMR (rate of change in resistance), $H_{ex}$ (the exchange coupling magnetic field of the pinned ferromagnetic layer) and $H_{cf}$ (the coercive force of the free ferromagnetic layer in the direction a shown in FIG. 3, i.e., the leakage magnetic field from the magnetic medium and coercive force in the Z direction shown in FIG. 1) of each of the samples shown in Table 1, the samples subjected to first annealing in the magnetic field direction and second annealing in the magnetic field direction at 90 degrees with the magnetic field direction of first annealing show the values of ΔMR and $H_{ex}$ equivalent to those of a comparative sample subjected to first and second annealing in the same magnetic field direction, and smaller $H_{cf}$ values than the comparative sample. If the $H_{cf}$ value is decreased, when the magnetization direction of the free ferromagnetic layer is rotated by the leakage magnetic field from a magnetic recording medium, the magnetization direction is rotated with high stability. By decreasing the $H_{cf}$ value, the bias applied by the hard bias structure can be decreased, and output can be improved.

On an Si substrate coated with an $Al_2O_3$ film was formed a laminate by sputtering using a high frequency magnetron sputtering apparatus and a plurality of targets to form a laminated structure of Ta (50 Å)/PtMn (200 Å)/CoFe (30 Å)/Cu (22 Å)/CoFe (10 Å)/NiFe (70 Å)/CoFe (10 Å)/Cu (22 Å)/CoFe (30 Å)/PtMn (200 Å)/Ta (50 Å), followed by two-step heat treatment in a magnetic field under the conditions shown in Table 2 to produce magnetoresistive element samples.

TABLE 2

Conditions of First Annealing and Characteristics after Annealing

| Annealing temp., Applied magnetic field | ΔMR (%) | Hex (Oe) | Hcf (Oe) | Easy axis of magnetization of Free layer |
|---|---|---|---|---|
| 210° C. × 4HR, 1kOe | 10.5 | 400 | 4 | Magnetic field direction of first annealing |
| 230° C. × 4HR, 2kOe | 10.3 | 600 | 3 | Magnetic field direction of first annealing |
| 250° C. × 2HR, 4kOe | 10.0 | 600 | 4 | Magnetic field direction of first annealing |
| Conditions of Second Annealing and Characteristics after Annealing | | | | |
| 200° C. × 2HR, 100 Oe | 10.4 | 440 | ≦0.5 | Magnetic field direction of second annealing |

TABLE 2-continued

Conditions of First Annealing and Characteristics after Annealing

| Annealing temp., Applied magnetic field | ΔMR (%) | Hex (Oe) | Hcf (Oe) | Easy axis of magnetization of Free layer |
|---|---|---|---|---|
| 200° C. × 2HR, 100 Oe | 10.2 | 600 | ≦0.5 | Magnetic field direction of second annealing |
| 200° C. × 2HR, 100 Oe | 10.1 | 580 | ≦0.5 | Magnetic field direction of second annealing |

: Si substrate/aluminum oxide/Ta50Å/PtMn200Å/CoFe30Å/Cu22Å/CoFe10Å/NiFe70Å/CoFe10Å/Cu22Å/CoFe30Å/PtMn200Å/Ta50Å

As be seen from the values of ΔMR, $H_{ex}$ and $H_{cf}$ of each of the samples shown in Table 2, even in this sample structure, the samples subjected to first annealing in the magnetic field direction and second annealing in the magnetic field direction at 90 degrees with the magnetic field direction of first annealing show $H_{cf}$ values equivalent to the samples shown in Table 1. Therefore, even in this laminated structure, the magnetization direction is rotated with high stability, and it is possible to decrease the hard bias and improve output.

The structure shown in Table 2 is a dual type structure in which PtMn (200 Å) formed on Ta (50 Å) and PtMn (200 Å) formed below Ta (50 Å) serve as the pinned ferromagnetic layers, and CoFe (10 Å)/NiFe (70 Å)/CoFe (10 Å) sandwiched between the two Cu (22) layers constitutes the free ferromagnetic layer. It is also apparent that this structure permits achievement of higher ΔMR than the structure shown in Table 1.

Figure 4:
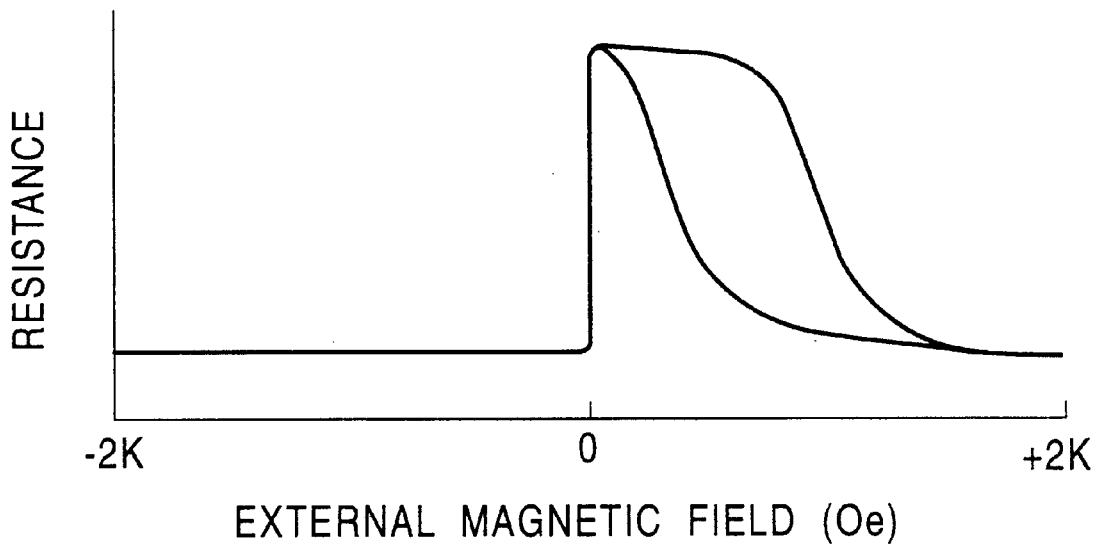
FIG. 4 is a diagram showing an R-H curve major loop of a sample obtained after first annealing in examples.
Figure 5:
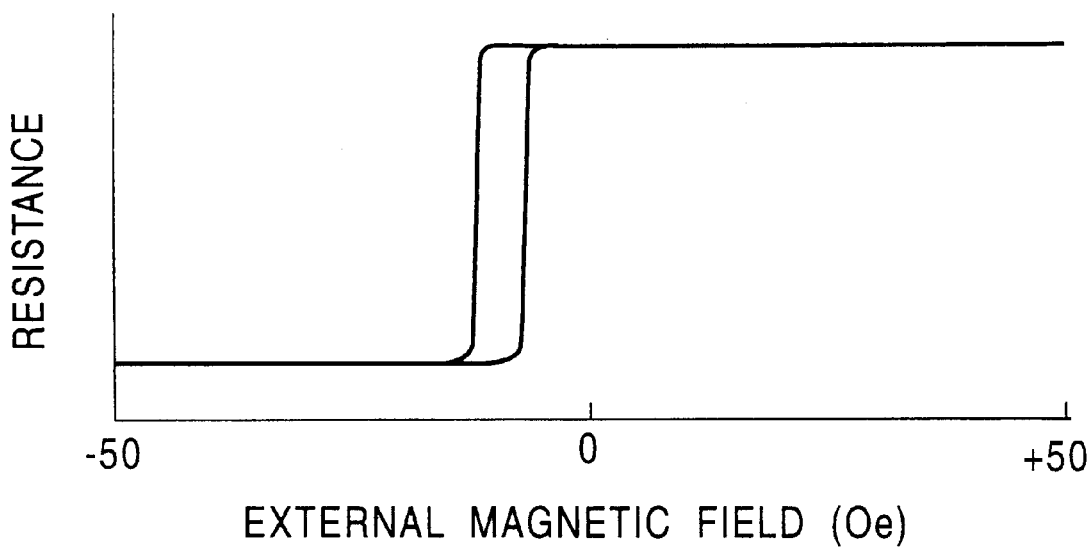
FIG. 5 is a diagram showing an R-H curve minor loop of a sample obtained after first annealing in examples.
Figure 6:
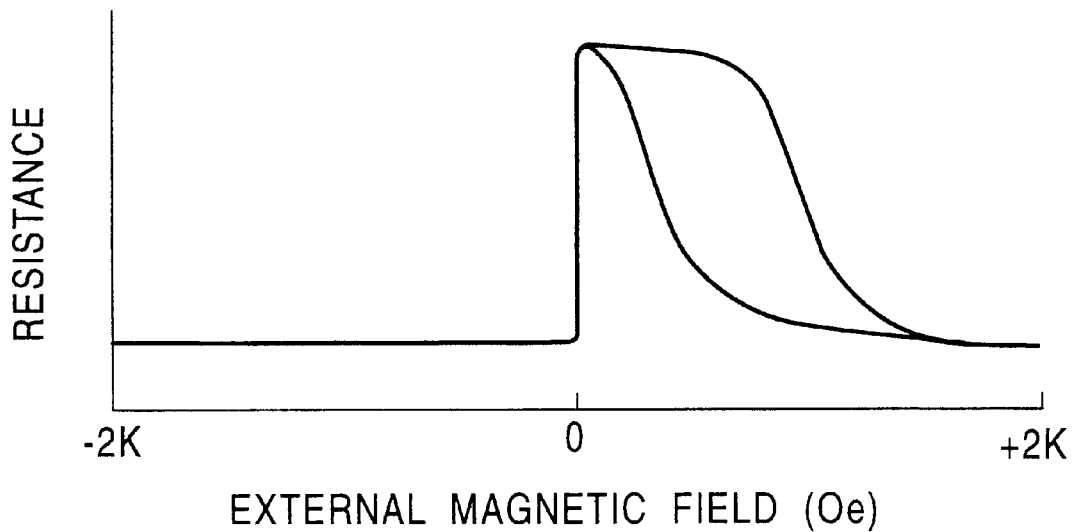
FIG. 6 is a diagram showing an R-H curve major loop of a sample obtained after second annealing in examples.
Figure 7:
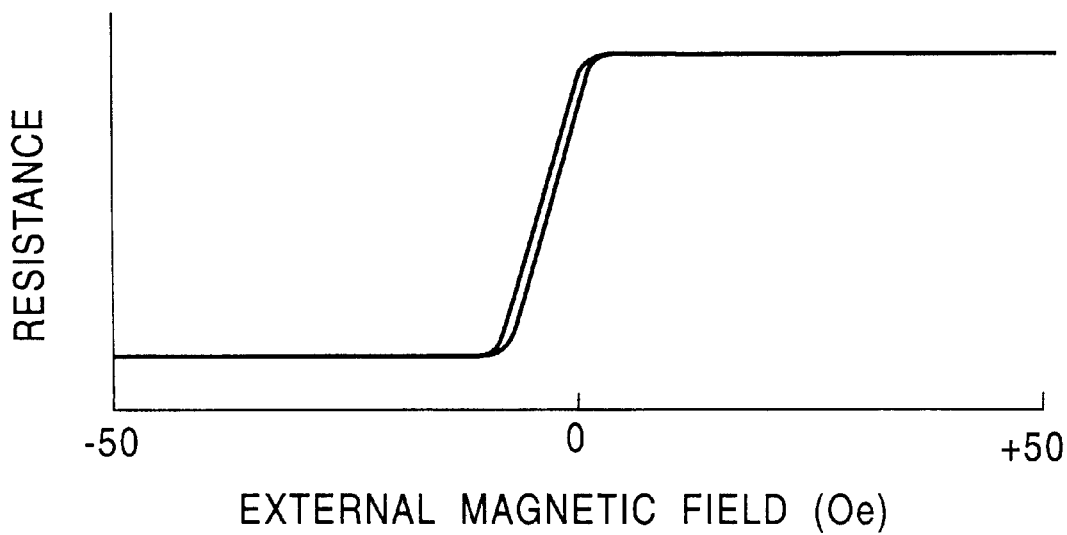
FIG. 7 is a diagram showing an R-H curve minor loop of a sample obtained after second annealing in examples.
Figure 8:
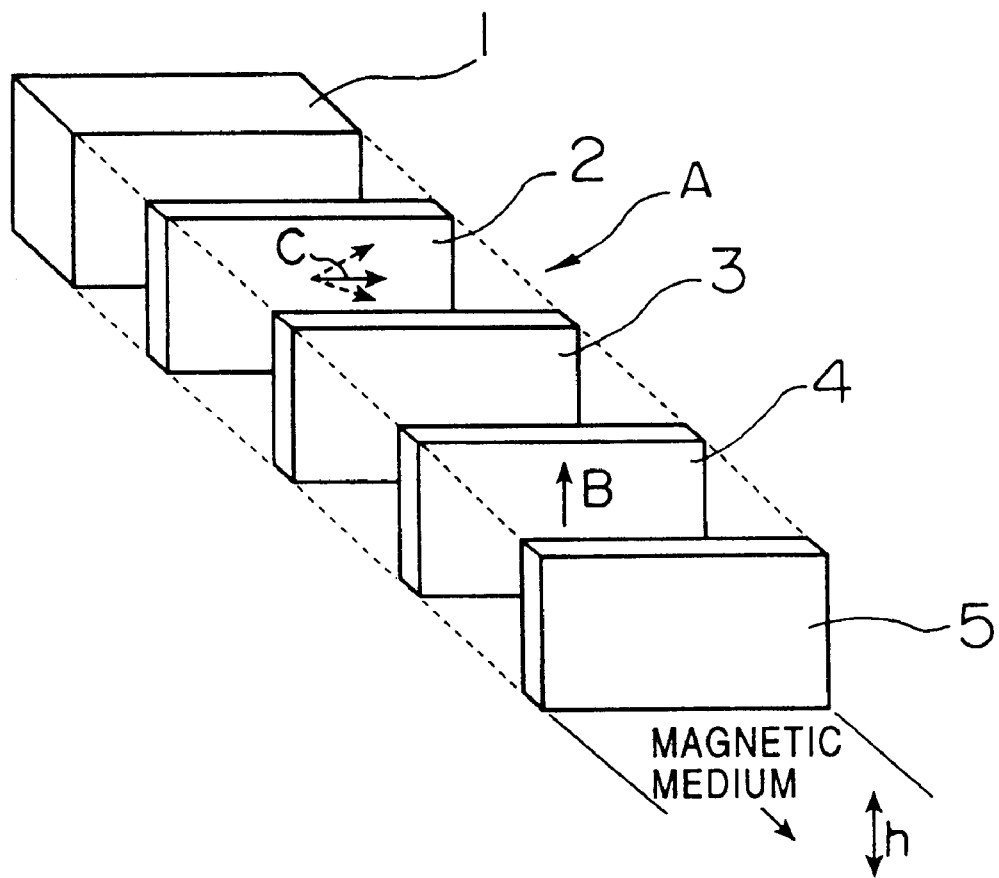
FIG. 8 is a drawing showing the structure of an example of conventional magnetoresistive elements.

FIGS. 4 and 5 show the major loop (the R-H curve of the pinned ferromagnetic layer) and the minor loop (the R-H curve of the free ferromagnetic layer), respectively, of R-H curves of the sample obtained after first annealing (230° C.×4 hours, 2 kOe) shown in Table 1. FIGS. 6 and 7 show the major loop (the R-H curve of the pinned ferromagnetic layer) and the minor loop (the R-H curve of the free ferromagnetic layer), respectively, of R-H curves of the sample obtained after second annealing (200° C.×2 hours, 100 Oe).

The results shown in FIGS. 4 to 7 reveal that the coercive force of the free ferromagnetic layer is decreased by two-step annealing.

Example 2

Next, a laminate was formed by sputtering by the same method as Example 1 to obtain a laminated structure of Ta (50 Å)/NiFe (70 Å)/CoFe (10 Å)/Cu (25 Å)/CoFe (30 Å)/PtMn (300 Å)/Ta (50 Å), followed by two-stage heat treatment in a magnetic field under the conditions shown in Table 3 to produce the magnetoresistive element B shown in FIG. 2. In this example, the compositions of PtMn, CoFe and NiFe were the same as Example 1.

TABLE 3

Conditions of First Annealing and Characteristics after Annealing

| Annealing temp., Applied magnetic field | ΔMR (%) | Hex (Oe) | Hcf (Oe) | Easy axis of magnetization of Free layer |
|---|---|---|---|---|
| 230° C. × 10HR, 2kOe | 6.5 | 700 | 3 | Magnetic field direction of first annealing |
| 250° C. × 10HR, 2kOe | 6.0 | 800 | 4 | Magnetic field direction of first annealing |
| Conditions of Second Annealing and Characteristics after Annealing | | | | |
| 250° C. × 3HR, 50 Oe | 6.2 | 650 | ≦0.5 | Magnetic field direction of second annealing |
| 270° C. × 3HR, 50 Oe | 5.8 | 700 | ≦0.5 | Magnetic field direction of second annealing |

As be seen from the values of ΔMR, $H_{ex}$ (the exchange coupling magnetic field of the pinned ferromagnetic layer) and Hcf (the coercive force of the free ferromagnetic layer, i.e., the leakage magnetic field from the magnetic medium and coercive force in the Z direction shown in FIG. 2) of each of the samples shown in Table 3, the samples subjected to first annealing in the magnetic field direction and second annealing in the magnetic field direction at 90 degrees with the magnetic field direction of first annealing show ΔMR, $H_{ex}$ and $H_{cf}$ values smaller than the comparative sample subjected to first and second annealing in the same magnetic field direction. Therefore, like in Example 1, it is possible to decrease the hard bias applied by the hard bias structure and improve output by decreasing the $H_{cf}$ value.

What is claimed is:

1. A method of producing a magnetoresistive element which comprises a first ferromagnetic layer in which magnetization is freely reversed according to an external magnetic field, a non-magnetic layer, a second ferromagnetic layer in which reversal of magnetization is pinned, and an antiferromagnetic layer pinning said magnetization of the second ferromagnetic layer, said method comprising:

forming a laminate comprising a first ferromagnetic layer, a non-magnetic layer, a second ferromagnetic layer and an antiferromagnetic layer; and performing heat treatment to said laminate under different conditions required for setting different directions of easy axis of magnetization of the first ferromagnetic layer and the second ferromagnetic layer;

wherein the heat treatment comprises first annealing at a predetermined temperature in a first magnetic field applied in a first direction to pin magnetization of second ferromagnetic layer by the adjacent antiferromagnetic layer, and second annealing in a second magnetic field applied in a second direction substantially perpendicular to the first direction so that the direction of easy magnetization axis of the first ferromagnetic layer is substantially perpendicular to the direction of easy axis of magnetization of the second ferromagnetic layer;

wherein the second magnetic field in the second direction is smaller than the exchange coupling magnetic field of the second ferromagnetic layer in which magnetization is pinned by the adjacent antiferromagnetic layer, wherein the retention temperature of the second annealing is not more than the blocking temperature of the antiferromagnetic layer.

2. A method of producing a magnetoresistive element according to claim 1, wherein the first magnetic field in the first direction is 1 to 4 kOe, and the second magnetic field in the second direction is 50 to 400 Oe.

3. A method of producing a magnetoresistive element according to claim 1, wherein the retention temperature of the first annealing is 210 to 250° C.

4. A method of producing a magnetoresistive element according to claim 1, wherein the retention temperature of the second annealing is 150 to 250° C.

5. A method of producing a magnetoresistive element according to claim 1, wherein the first ferromagnetic layer is made of any one of NiFe alloy, CoFe alloy, NiCo alloy, HiCoFe alloy, and Co, the non-magnetic layer is made of any one of Cu, CuAu and CuNi, and the second ferromagnetic layer is made of any one of NiFe alloy, CoFe alloy, NiCo alloy, HiCoFe alloy, and Co and provided adjacent to the antiferromagnetic layer made of any one of PtMn, NiMn, IrMn, RhMn, PdMn and RuMn, $\alpha$-Fe$_2$O$_3$.

6. The method of claim 1, wherein at least one of the first ferromagnetic layer and the second ferromagnetic layer is made of a material selected from the group consisting of NiFe alloys, NiCo alloys, CoFe alloys, NiFeCo alloys, and Co.

7. The method of claim 1, wherein at least one of the first ferromagnetic layer and the second ferromagnetic layer comprises a laminated structure comprising at least layers of materials selected from NiFe alloys, NiCo alloys, CoFe alloys, NiFeCo alloys, and Co.

8. The method of claim 7, wherein the laminated structure comprises a material layer containing Co, which is arranged adjacent to the nonmagnetic layer.

9. The method of claim 1, wherein at least one of the first ferromagnetic layer and the second ferromagnetic layer is made of a material containing Co, the Co content being high on the side adjacent to the nonmagnetic layer with a content gradient in which the Co content gradually decreases in the direction away from the nonmagnetic layer.

10. The method of claim 1, wherein the nonmagnetic layer is made of a material selected from Cu, Cr, Au, and Ag.

11. The method of claim 1, wherein the antiferromagnetic layer is made of any one antiferromagnetic material selected from PtMn, NiMn, IrMn, RhMn, PdMn and $\alpha$-Fe$_2$O$_3$.

12. The method of claim 1, wherein hard magnetic layers are arranged on both sides of the laminate, for applying a bias to the first magnetic layer.

13. The method of claim 12, wherein the hard magnetic layers are made of a material selected from Co—Pt alloys, CoCr, and Pt alloys.

14. The method of claim 1, wherein the process for forming the laminate comprises the steps of forming the first ferromagnetic layer, forming the nonmagnetic layer on the first ferromagnetic layer, forming the second ferromagnetic layer on the nonmagnetic layer, and forming the antiferromagnetic layer on the second ferromagnetic layer.

15. The method of claim 1, wherein the process for forming the laminate comprises the steps of forming the antiferromagnetic layer, forming the second ferromagnetic layer on the antiferromagnetic layer, forming the nonmagnetic layer on the second ferromagnetic layer, and forming the first ferromagnetic layer on the nonmagnetic layer.

16. A method of producing a magnetoresistive element comprising:

forming a laminate comprising a first antiferromagnetic layer, a first ferromagnetic layer, a first nonmagnetic layer, third ferromagnetic layer, second nonmagnetic layer, second ferromagnetic layer and second antiferromagnetic layer, performing heat treatment to said laminate under different conditions required for setting different directions of easy axis of magnetization of the third ferromagnetic layer and the first or second ferromagnetic layers; wherein the heat treatment comprises first annealing at a predetermined temperature in a first magnetic field applied in a first direction to pin magnetization of first and second ferromagnetic layers by the adjacent first and second antiferromagnetic layers, respectively, and second annealing in a second magnetic field applied in a second direction substantially perpendicular to the first direction so that direction of easy magnetization axis of the third ferromagnetic layer is substantially perpendicular to the direction of easy axis of magnetization of the first and second ferromagnetic layers.

wherein a second magnetic field in the second direction is smaller than the exchange coupling magnetic fields the first and second ferromagnetic layers in which magnetization is pinned by the adjacent first and second antiferromagnetic layers, respective, wherein the retention temperature of the second annealing is not more than the blocking temperature of the first and second antiferromagnetic layers.

17. The method of claim 16, wherein the first magnetic field in the first direction is 1 to 4 kOe, and the second magnetic field in the second direction is 50 to 400 Oe.

18. The method of claim 16, wherein the retention temperature of the first annealing is 210 to 250° C.

19. The method of claim 16, wherein the retention temperature of the second annealing is 150 to 250° C.

20. The method of claim 16, wherein the third ferromagnetic layer is made of any one of NiFe alloy, CoFe alloy, and Co, NiCo alloy, HiCoFe alloy, the non-magnetic layer is made of any one of Cu, CuAu and CuNi, and the fist and second ferromagnetic layers is made of any one of NiFe alloy, CoFe alloy, NiCo alloy, NiCoFe alloy and Co and provided adjacent to the antiferromagnetic layer made of any one of PtMn, NiMn, IrMn, RhMn, PdMn, RuMn, and $\alpha$-Fe$_2$O$_3$.

21. The method of claim 16, wherein at least one of the first ferromagnetic layer, the second ferromagnetic layer and the third ferromagnetic layer is made of a material selected from the group consisting of NiFe alloys, NiCo alloys, CoFe alloys, NifeCo alloys, and CO.

22. The method of claim 16, wherein at least one of the first ferromagnetic layer, the second ferromagnetic layer and the third ferromagnetic layer comprises a laminated structure comprising at least layers of materials selected from NiFe alloys, NiCo alloys, CoFe alloys, NiFeCo alloys, and Co.

23. The method of claim 16, wherein the laminated structure comprises a material layer containing Co, which is arranged adjacent to the nonmagnetic layer.

24. The method of claim 16, wherein at least one of the first ferromagnetic layer, the second ferromagnetic layer and the third ferromagnetic layer is made of a material containing Co, the Co content being high on the side adjacent to the nonmagnetic layer with a content gradient in which the Co content gradually decreases in the direction away from the nonmagnetic layer.

25. The method of claim 16, wherein the first nonmagnetic layer and the second nonmagnetic layer are made of a material selected from Cu, Au, and Ag.

26. The method of claim 16, wherein the first antiferromagnetic layer and the second antiferromagnetic layer are made of any one antiferromagnetic material selected from PtMn, NiMn, IrMn, RhMn, PdMn, and $\alpha$-$Fe_2O_3$.

27. The method of claim 16, wherein hard magnetic layers are arranged on both sides of the laminate, for applying a bias to the third magnetic layer.

28. The method of claim 27, wherein the hard magnetic layers are made of a material selected from Co—Pt alloys, CoCr, and Pt alloys.

29. The method of claim 16, wherein the process for forming the laminate comprises the steps of forming the first ferromagnetic layer on the first antiferromagnetic layer, forming the first nonmagnetic layer on the first ferromagnetic layer, forming the third ferromagnetic layer on the first nonmagnetic layer, forming the second nonmagnetic layer on the third ferromagnetic layer, forming the second ferromagnetic layer on the second nonmagnetic layer, and forming the second antiferromagnetic layer on the second ferromagnetic layer.

* * * * *

UNITED STATES PATENT AND TRADEMARK OFFICE
CERTIFICATE OF CORRECTION

PATENT NO.    : 6,074,707
DATED         : June 13, 2000
INVENTOR(S)   : Yukie Nakazawa et al.

Page 1 of 1

It is certified that error appears in the above-identified patent and that said Letters Patent is hereby corrected as shown below:

Claim 16,
Line 24, change "layers." to -- layers, --.
Line 27, change "fields the" to -- fields of the --.

Claim 20,
Line 4, change "fist" to -- first --.
Line 5, change "is" to -- are --.

Column 21,
Line 5, change "NifeCo" to -- NiFeCo --.

Signed and Sealed this

Twenty-fifth Day of December, 2001

Attest:

Attesting Officer

JAMES E. ROGAN
Director of the United States Patent and Trademark Office